(12) United States Patent
Asami

(10) Patent No.: US 8,987,899 B2
(45) Date of Patent: Mar. 24, 2015

(54) CIRCUIT BOARD, SEMICONDUCTOR ELEMENT, SEMICONDUCTOR DEVICE, METHOD FOR MANUFACTURING CIRCUIT BOARD, METHOD FOR MANUFACTURING SEMICONDUCTOR ELEMENT, AND METHOD FOR MANUFACTURING SEMICONDUCTOR DEVICE

(75) Inventor: Hiroshi Asami, Shizuoka (JP)

(73) Assignee: Sony Corporation, Tokyo (JP)

( * ) Notice: Subject to any disclaimer, the term of this patent is extended or adjusted under 35 U.S.C. 154(b) by 25 days.

(21) Appl. No.: 13/357,046

(22) Filed: Jan. 24, 2012

(65) Prior Publication Data

US 2012/0267778 A1 Oct. 25, 2012

(30) Foreign Application Priority Data

Jan. 31, 2011 (JP) ................. 2011-017407

(51) Int. Cl.
| | |
|---|---|
| *H01L 23/48* | (2006.01) |
| *H01L 23/498* | (2006.01) |
| *H01L 21/48* | (2006.01) |
| *H01L 21/56* | (2006.01) |
| *H01L 23/31* | (2006.01) |
| *H05K 1/11* | (2006.01) |
| *H05K 3/34* | (2006.01) |
| *H05K 3/28* | (2006.01) |
| *H01L 23/00* | (2006.01) |

(52) U.S. Cl.
CPC ...... *H01L 23/49816* (2013.01); *H01L 21/4853* (2013.01); *H01L 21/563* (2013.01); *H01L 23/3142* (2013.01); *H05K 1/111* (2013.01); *H05K 3/3436* (2013.01); *H01L 23/49827* (2013.01); *H01L 2224/73204* (2013.01); *H05K 3/28* (2013.01); *H05K 3/3484* (2013.01); *H05K 2201/099* (2013.01); *H05K 2203/0315* (2013.01); *H05K 2203/043* (2013.01); *H01L 24/13* (2013.01); *H01L 24/16* (2013.01); *H01L 2224/16225* (2013.01); *H01L 2224/81024* (2013.01); *H01L 2224/81193* (2013.01); *H01L 2224/81815* (2013.01); *H01L 2224/8191* (2013.01); *H01L 2224/131* (2013.01); *H01L 2224/16237* (2013.01); *H01L 2924/00013* (2013.01); *H01L 2224/81192* (2013.01)
USPC .......................................... 257/737

(58) Field of Classification Search
CPC ........... H01L 2924/01078; H01L 2924/01079; H01L 2924/01029; H01L 25/0657; H01L 25/105; H01L 2224/48091
USPC ......... 257/737–738, 685–686, 777, 778, 676, 257/774
See application file for complete search history.

(56) References Cited

U.S. PATENT DOCUMENTS 6,770,971 B2 * 8/2004 Kouno et al. ................. 257/734
8,133,762 B2 * 3/2012 Pagaila et al. ................. 438/117

FOREIGN PATENT DOCUMENTS

JP 2000-077471 3/2000

* cited by examiner

*Primary Examiner* — Hoa B Trinh
(74) *Attorney, Agent, or Firm* — K&L Gates LLP

(57) ABSTRACT

A circuit board includes: an electrode portion which has a copper layer, a copper oxide layer formed thereon, and a removal portion formed by partially removing the copper oxide layer so as to partially expose the copper layer from the copper oxide layer; and a solder bump for flip chip mounting formed on the copper layer exposed by the removal portion.

10 Claims, 13 Drawing Sheets

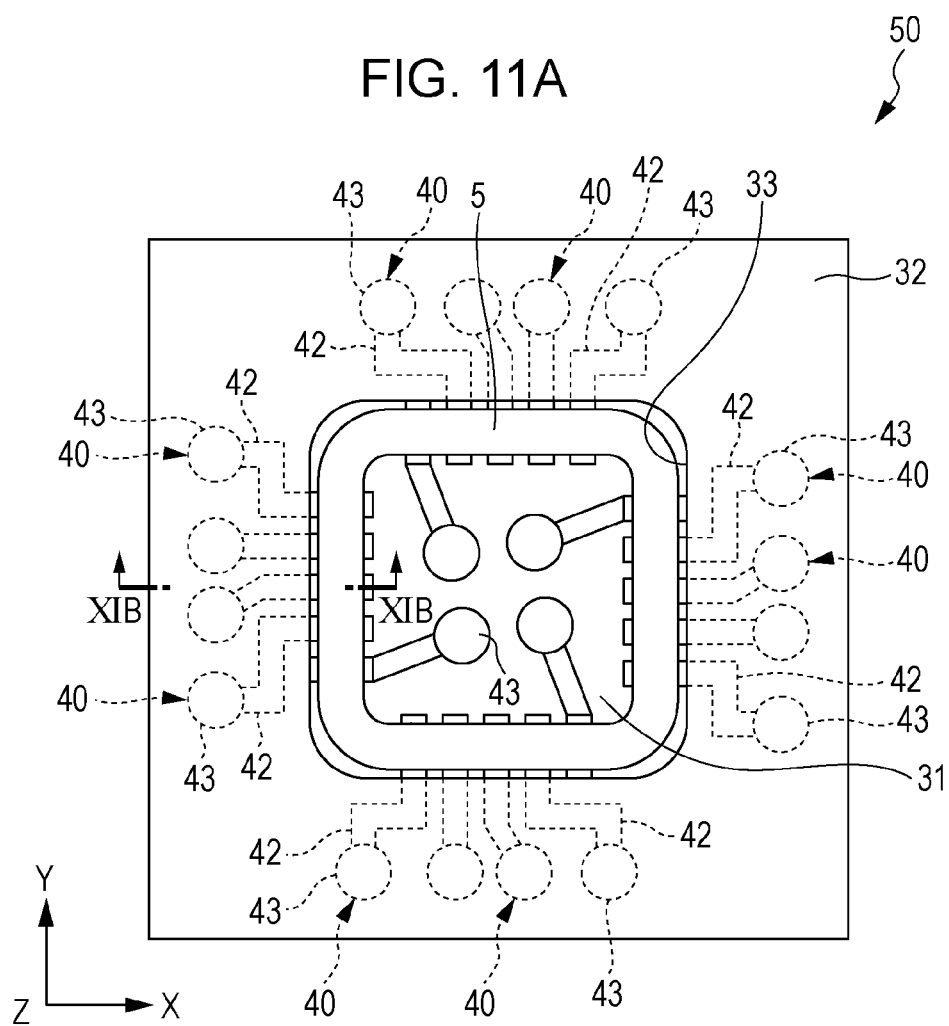

FIG. 12A
FIG. 12B
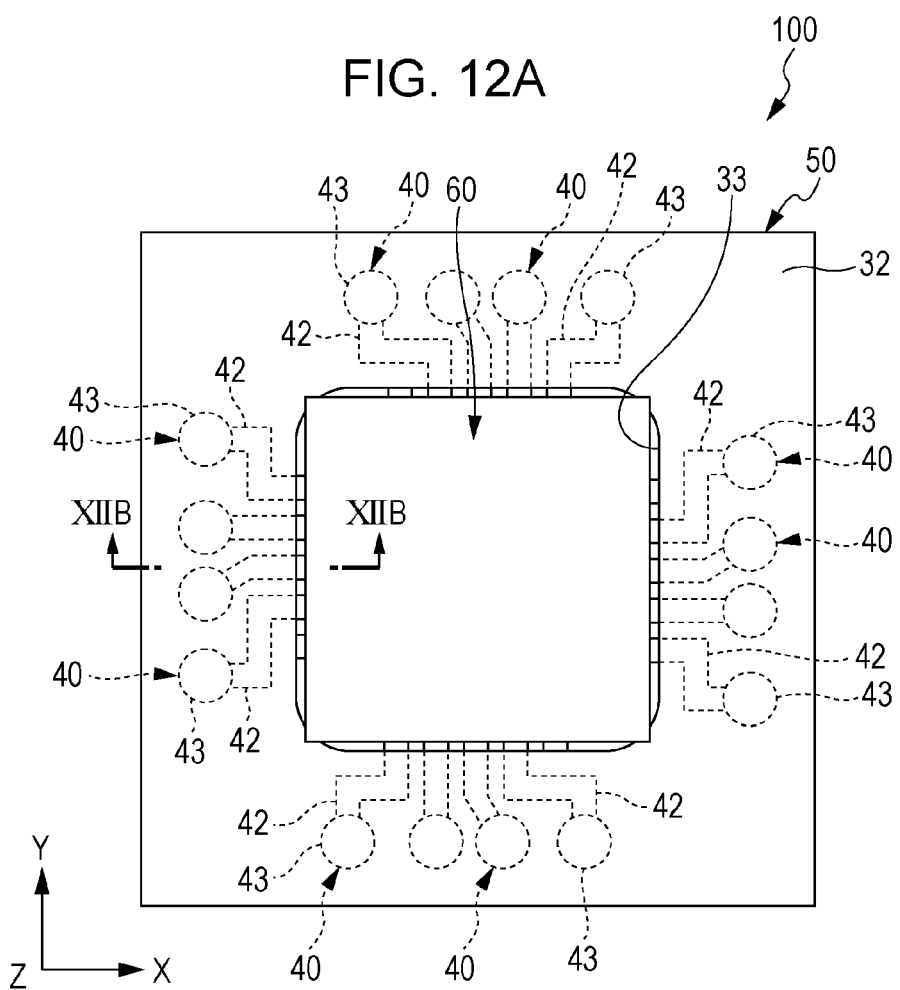
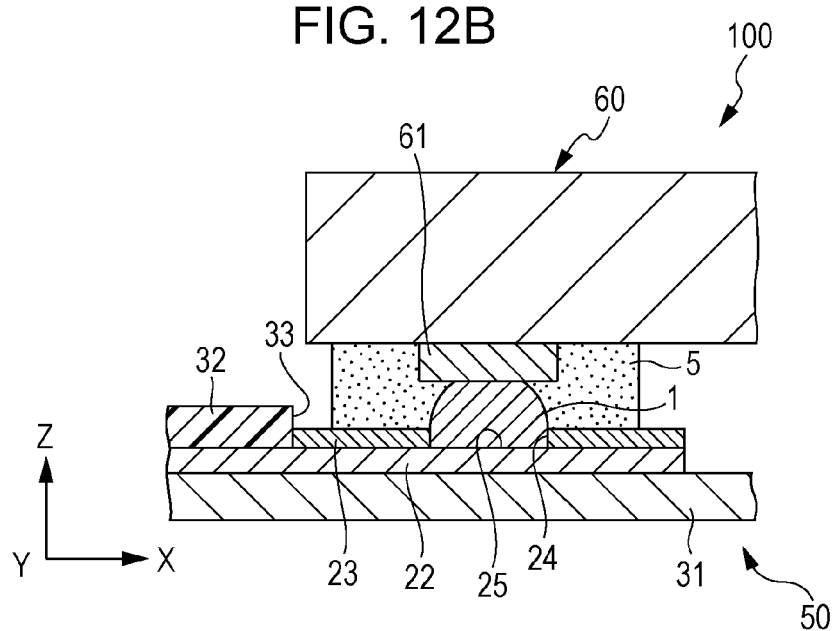

CIRCUIT BOARD, SEMICONDUCTOR ELEMENT, SEMICONDUCTOR DEVICE, METHOD FOR MANUFACTURING CIRCUIT BOARD, METHOD FOR MANUFACTURING SEMICONDUCTOR ELEMENT, AND METHOD FOR MANUFACTURING SEMICONDUCTOR DEVICE

CROSS REFERENCES TO RELATED APPLICATIONS

The present application claims priority to Japanese Priority Patent Application JP 2011-017407 filed in the Japan Patent Office on Jan. 31, 2011, the entire content of which is hereby incorporated by reference.

BACKGROUND

The present disclosure relates to techniques of a circuit board and a semiconductor element, in each of which solder bumps are formed for flip chip mounting, and a semiconductor device including a circuit board and a semiconductor element, and the like.

In recent years, a flip chip mounting method attracts attention as a mounting technique. This flip chip mounting method is a technique of mounting a semiconductor element, such as a semiconductor chip, on a substrate in a facedown state or mounting a semiconductor element on a semiconductor element in a facedown state (so-called "chip on chip"). Since having advantages, such as reduction in mounting area, as compared to a wire bonding method, recently, this flip chip mounting method has been used increasingly widely instead of the wire bonding method.

In the flip chip mounting method, for example, a terminal electrode called a bump is formed on a semiconductor element, and an electrode is formed on the substrate at a position corresponding to the bump on the semiconductor element. A solder bump is formed on the electrode on the substrate. In addition, the bump on the semiconductor and the electrode on the substrate are disposed to face each other and are fusion-joined to each other with the solder bump provided therebetween.

In general, as a method of forming a solder bump on an electrode, for example, a solder ball mounting method or a cream solder printing method may be used.

In addition, as a method of forming a solder bump on an electrode, for example, a technique disclosed in Japanese Unexamined Patent Application Publication No. 2000-77471 (paragraphs [0032] to [0042], and FIGS. 5 and 6) may be mentioned. A circuit board disclosed in Japanese Unexamined Patent Application Publication No. 2000-77471 has a conductor pattern having a wiring pattern and a connection pad. The width of the connection pad is formed wider than that of the wiring pattern. When a solder bump is formed, a solder powder is applied on the surface of the conductor pattern together with a flux and is then melted by heating. When the solder powder is melted, a phenomenon in which the solder gathers on the wide connection pad occurs, and the solder bump is formed on the connection pad. As described above, the solder bump is formed at a position exactly corresponding to that of a bump on a semiconductor element.

SUMMARY

In recent years, concomitant with increase in density of semiconductor elements, such as a semiconductor chip, the pitch between bumps provided on a semiconductor element tends to be decreased. In response to this decrease in pitch between bumps, it becomes necessary to decrease the pitch between electrodes or to form a minute solder bump on each electrode at a substrate side.

However, according to the technique disclosed in Japanese Unexamined Patent Application Publication No. 2000-77471, it is difficult to form a conductor pattern with a narrow pitch since the structure of the conductor pattern is complicated. On the other hand, in the case in which a minute solder bump is formed on an electrode, for example, when a solder ball mounting method is used, the size of the solder ball is decreased, and hence it becomes disadvantageously difficult to place this minute solder ball at a position of the electrode.

In consideration of the situation as described above, it is desirable to provided a technique of a circuit substrate and the like in which the pitch between electrodes can be easily decreased and/or a minute solder bump can be easily formed on an electrode.

A circuit board according to one embodiment of the present disclosure includes an electrode portion and a solder bump.

The electrode portion has a copper layer, a copper oxide layer formed thereon, and a removal portion formed by partially removing the copper oxide layer so as to partially expose the copper layer from the copper oxide layer.

The solder bump is a solder bump for flip chip mounting formed on the copper layer exposed by the removal portion.

In the present disclosure, a copper oxide layer is formed on a copper layer, and the copper oxide layer is partially removed so that the copper layer is partially exposed from the copper oxide layer, thereby forming a removal portion. A solder bump is formed on the copper layer exposed by the removal portion. When this solder bump is formed, first, for example, cream solder or the like is applied on the copper layer exposed by the removal portion and on the copper oxide layer located along the periphery of the removal portion. Subsequently, this cream solder is heated. In this case, solder is likely to be adhered to copper but is not likely to be adhered to copper oxide. This relationship is used in the present disclosure. That is, when the cream solder is heated, the solder bump is formed on the copper layer (exposed by the removal portion) to which solder is likely to adhere and is not formed on the copper oxide layer located along the periphery of the removal portion. As described above, in the present disclosure, since the solder bump can be formed at a place corresponding to the removal portion, a minute solder bump can be easily formed on the electrode portion by adjusting the size of the removal portion. In addition, since it is not necessary to complicate the shape of the electrode portion, the pitch between the electrode portions can be easily decreased.

In the above circuit board, the copper oxide layer may be formed on the copper layer so that a predetermined ten point average roughness Rz is imparted to the surface of the copper oxide layer.

As described above, by imparting the predetermined ten point average roughness to the surface of the copper oxide layer, when the circuit board is fixed to other components, such as a semiconductor element, with an underfill in a subsequent step, the adhesion between the underfill and the copper oxide layer can be improved.

In the above circuit board, the ten point average roughness Rz may be in a range of 20 to 200 nm.

Accordingly, the adhesion between the underfill and the copper oxide layer can be effectively improved.

In the above circuit board, the copper oxide layer may be formed on the copper layer by performing a wet treatment thereon, and when the copper oxide layer is formed by the wet treatment, the ten point average roughness Rz may be imparted to the surface of the copper oxide layer.

As described above, the ten point average roughness Rz can be easily imparted to the surface of the copper oxide layer simultaneously when the copper oxide layer is formed by a wet treatment.

In the above circuit board, the solder bump may be formed on the electrode portion by applying a cream solder thereon which has an active force controlled so as to remove a copper oxide film unfavorably formed on the copper layer exposed by the removal portion and so as not to remove the copper oxide layer to which the ten point average roughness Rz is imparted.

Accordingly, while the unnecessary copper oxide film unfavorably formed on the copper layer exposed by the removal portion is appropriately removed, the copper oxide layer to which the ten point average roughness is imparted and which functions as a portion in close contact with the underfill can be prevented from being removed.

A semiconductor element according to one embodiment of the present disclosure includes an electrode portion and a solder bump.

The electrode portion has a copper layer, a copper oxide layer formed thereon, and a removal portion which is formed by partially removing the copper oxide layer so as to partially expose the copper layer from the copper oxide layer.

The solder bump is a solder bump for flip chip mounting formed on the copper layer exposed by the removal portion.

A semiconductor device according to one embodiment of the present disclosure includes a circuit board and a semiconductor element.

The circuit board includes an electrode portion and a solder bump.

The electrode portion has a copper layer, a copper oxide layer formed thereon, and a removal portion formed by partially removing the copper oxide layer so as to partially expose the copper layer from the copper oxide layer.

The solder bump is a solder bump for flip chip mounting formed on the copper layer exposed by the removal portion.

The semiconductor element has a joint portion to be fusion-joined to the copper layer exposed by the removal portion with the solder bump provided therebetween and is flip-chip mounted to the circuit board.

In the above semiconductor device, the copper oxide layer may be formed on the copper layer so that a predetermined ten point average roughness Rz is imparted to the surface of the copper oxide layer.

In this case, the semiconductor device may further includes an underfill which is filled between the circuit board and the semiconductor element and which fixes the circuit board to the semiconductor element while being placed in close contact with the surface of the copper oxide layer to which the ten point average roughness Rz is imparted.

In this semiconductor device, since the underfill is in close contact with the surface of the copper oxide layer to which the ten point average roughness Rz is imparted, the adhesion between the underfill and the copper oxide layer can be improved.

In the above semiconductor device, the copper layer exposed by the removal portion and the joint portion may be fusion-joined to each other with the solder bump provided therebetween in the state in which a flux having an active force controlled so as to remove an oxide film formed on the surface of the solder bump and so as not to remove the copper oxide layer to which the ten point average roughness Rz is imparted is applied on the solder bump and the copper oxide layer.

As described above, by controlling the active force of the flux, while the oxide film formed on the surface of the solder bump is appropriately removed, the copper oxide layer to which the ten point average roughness is imparted and which functions as a portion in close contact with the underfill can be prevented from being removed by the flux.

A semiconductor device according to another embodiment of the present disclosure includes a semiconductor element and a circuit board.

The semiconductor element includes an electrode portion which has a copper layer, a copper oxide layer formed thereon, and a removal portion formed by partially removing the copper oxide layer so as to partially expose the copper layer from the copper oxide layer; and a solder bump for flip chip mounting formed on the copper layer exposed by the removal portion.

The circuit board has a joint portion to be fusion-joined to the copper layer exposed by the removal portion with the solder bump provided therebetween, and the semiconductor element is flip-chip mounted to the circuit board.

A method for manufacturing a circuit board according to one embodiment of the present disclosure includes forming a copper oxide layer on a copper layer of an electrode portion of a circuit board.

The copper oxide layer is partially removed so as to partially expose the copper layer from the copper oxide layer, thereby forming a removal portion.

A solder bump for flip chip mounting is formed on the copper layer exposed by the removal portion.

In the above method for manufacturing a circuit board, in the forming a copper oxide layer, the copper oxide layer may be formed so as to impart a predetermined ten point average roughness Rz to the surface thereof In the above method for manufacturing a circuit board, the ten point average roughness Rz may be in a range of 20 to 200 nm.

In the method for manufacturing a circuit board described above, in the forming a copper oxide layer, a copper oxide layer may be formed on the copper layer by a wet treatment, and when the copper oxide layer is formed by the wet treatment, the ten point average roughness Rz may be imparted to the surface of the copper oxide layer.

In the method for manufacturing a circuit board, the forming a solder bump may be performed in such a way that the solder bump is formed on the electrode portion by applying creamy solder thereon having an active force controlled so as to remove a copper oxide film unfavorably formed on the copper layer exposed by the removal portion and so as not to remove the copper oxide layer to which the ten point average roughness Rz is imparted.

A method for manufacturing a semiconductor element according to another embodiment of the present disclosure includes forming a copper oxide layer on a copper layer of an electrode portion of a semiconductor element.

A removal portion is formed by partially removing the copper oxide layer so as to partially expose the copper layer from the copper oxide layer.

A solder bump for flip chip mounting is formed on the copper layer exposed by the removal portion.

A method for manufacturing a semiconductor device according to one embodiment of the present disclosure includes forming a copper oxide layer on a copper layer of an electrode portion of a circuit board.

The copper oxide layer is partially removed so as to partially expose the copper layer from the copper oxide layer, thereby forming a removal portion.

A solder bump for flip chip mounting is formed on the copper layer exposed by the removal portion.

The copper layer exposed by the removal portion and a joint portion of a semiconductor element is fusion-joined to each other with the solder bump provided therebetween.

In the above method for manufacturing a semiconductor device, the forming a copper oxide layer may be performed in such a way that the copper oxide layer is formed so that a predetermined ten point average roughness Rz is imparted to the surface thereof In this case, in the above method for manufacturing a semiconductor device, an underfill may be further filled between the circuit board and the semiconductor element to fix therebetween while the underfill is placed in close contact with the surface of the copper oxide layer to which the ten point average roughness Rz is imparted.

In the above method for manufacturing a semiconductor device, the performing fusion joining may be performed as described below. That is, a flux having an active force controlled so as to remove an oxide film formed on the surface of the solder bump and so as not to remove the surface of the copper oxide layer to which the ten point average roughness Rz is imparted is applied on the solder bump and the copper oxide layer, and in the state in which the flux is applied on the solder bump and the copper oxide layer, the copper layer exposed by the removal portion and the joint portion of the semiconductor element may be fusion-joined to each other with the solder bump provided therebetween.

A method for manufacturing a semiconductor device according to another embodiment of the present disclosure includes forming a copper oxide layer on a copper layer of an electrode portion of a semiconductor element.

The copper oxide layer is partially removed so as to partially expose the copper layer from the copper oxide layer, thereby forming a removal portion.

A solder bump for flip chip mounting is formed on the copper layer exposed by the removal portion.

The copper layer exposed by the removal portion and a joint portion of a circuit board are fusion-joined to each other with the solder bump provided therebetween.

As described above, according to the present disclosure, a technique of a circuit board or the like in which the pitch between electrode portions can be easily decreased and/or a minute solder bump can be easily formed on a electrode portion can be provided.

Additional features and advantages are described herein, and will be apparent from the following Detailed Description and the figures.

BRIEF DESCRIPTION OF THE FIGURES

FIGS. 11A and 11B are schematic views each illustrating the method for manufacturing a semiconductor device;

FIGS. 12A and 12B are schematic views each illustrating the method for manufacturing a semiconductor device;

DETAILED DESCRIPTION

Hereinafter, embodiments of the present disclosure will be described with reference to the drawings.

[Structure of Circuit Board]

Figure 1:
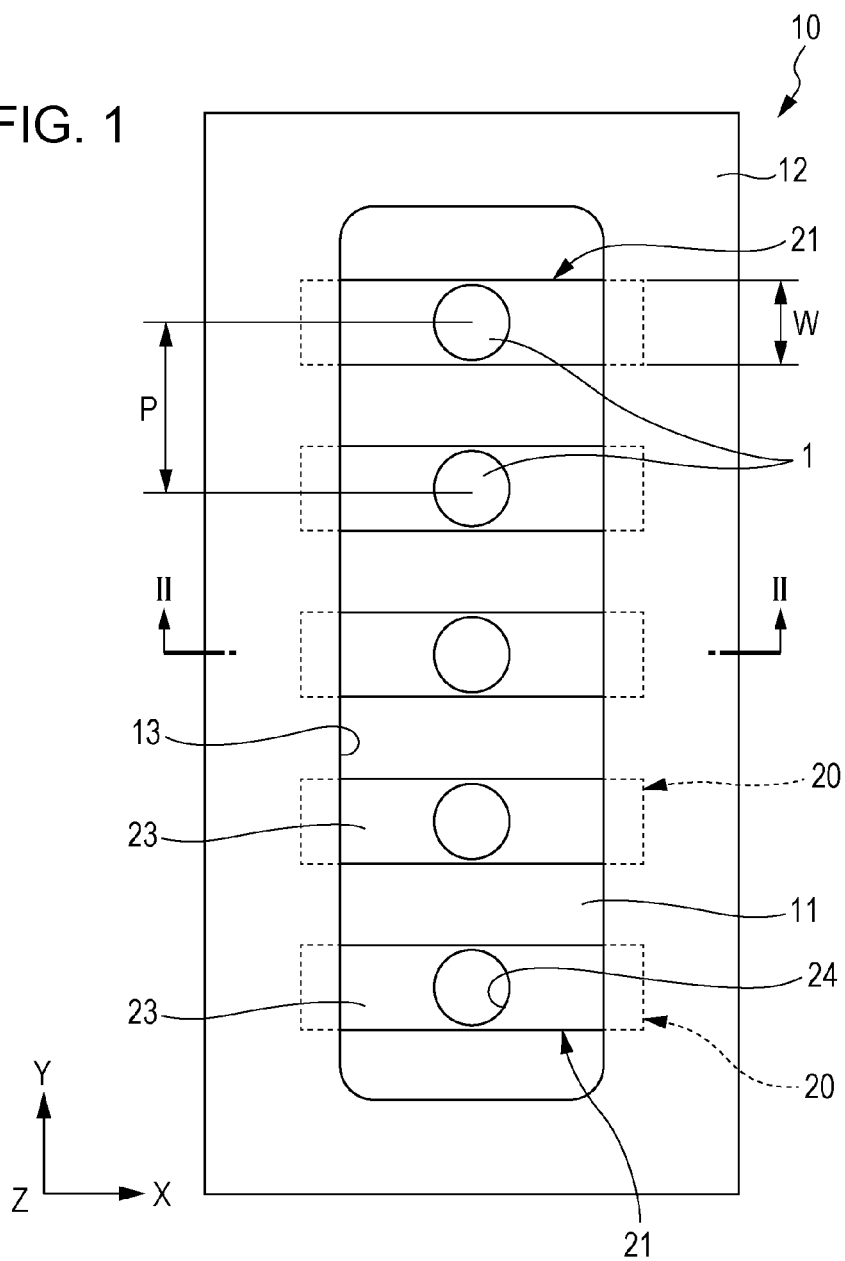
FIG. 1 is a plan view showing a circuit board according to one embodiment of the present disclosure.
Figure 2:
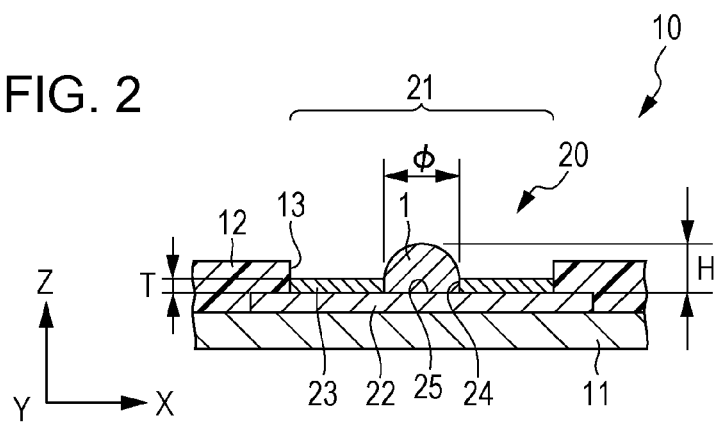
FIG. 2 is a cross-sectional view taken along the line II-II shown in FIG. 1.

FIG. 1 is a plan view showing a circuit board according to this embodiment. FIG. 2 is a cross-sectional view taken along the line II-II shown in FIG. 1.

As a circuit board 10 shown in FIGS. 1 and 2, for example, an interposer or a mother board may be mentioned. In addition, in FIGS. 1 and 2, in order to facilitate understanding, the structure of the circuit board 10 is simplified.

As shown in FIG. 1, for example, the circuit board 10 includes a substrate 11 formed of silicon or the like, a plurality of wiring sections 20 provided on the substrate 11, and a solder resist 12 formed of an epoxy resin or the like on the substrate 11 and the wiring sections 20. The solder resist 12 has an opening 13, and the substrate 11 and the wiring sections 20 are partially exposed at an upper side of the circuit board 10 through this opening 13.

The number of the wring sections 20 formed on the substrate 11 in this example is five. The wiring sections 20 each have a rectangular shape having a long side in one direction and are arranged parallel to each other. The wiring section 20 has an electrode portion 21. This electrode portion 21 is a portion to be electrically connected to a bump 61 (see FIGS. 12A to 14B) of a semiconductor element 60 which will be described later. Since the electrode portion 21 is electrically connected to the bump 61, the wiring section 20 is formed so as to be partially exposed from the solder resist 12.

A width W of the electrode portion 21 (wiring section 20) is set, for example, to approximately 20 to 100 μm, and a pitch P between the electrode portions 21 (between the wiring sections 20) is set, for example, to approximately 40 to 200 μm.

The electrode portion 21 includes a copper layer 22 and a copper oxide layer 23 formed thereon. A thickness T of the copper oxide layer 23 is typically set in a range of 20 to 80 Å. The reason the upper limit of the thickness T of the copper oxide layer 23 is set to approximately 80 Å is that if the thickness thereof is too large, when a hole 24 (removal portion) penetrating the copper oxide layer 23 is formed by a laser as described later (see FIGS. 5A and 5B), the hole 24 may not be easily formed.

Figure 14A:
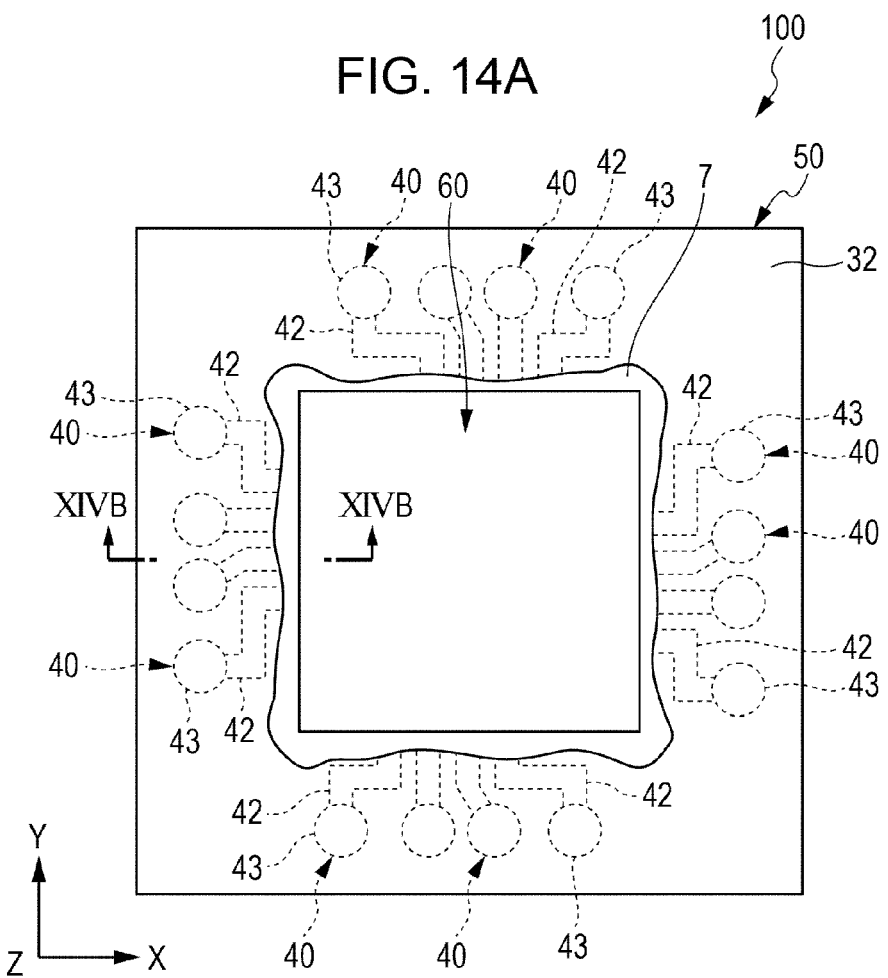
FIGS. 14A and 14B are schematic views each illustrating the method for manufacturing a semiconductor device.
Figure 14B:
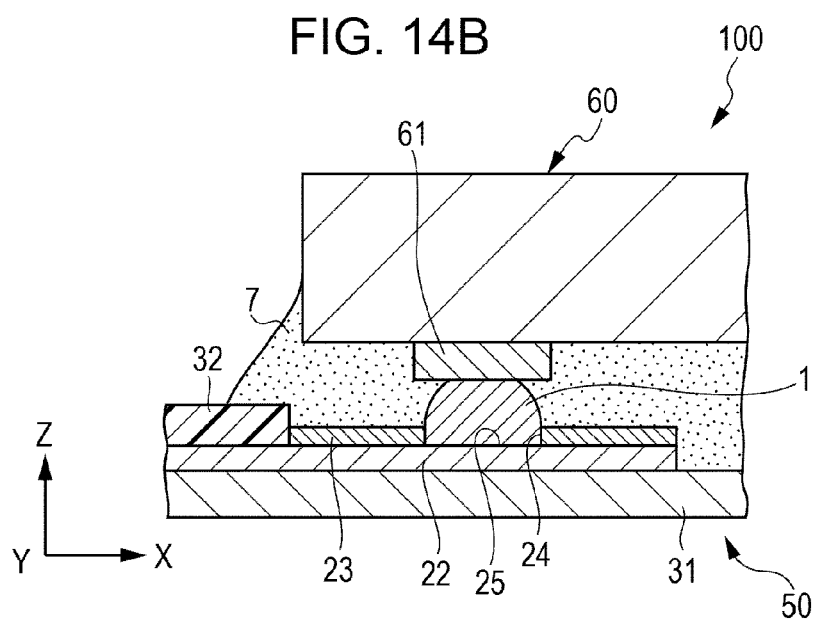

The copper oxide layer 23 has a predetermined ten point average roughness Rz on the surface thereof This ten point average roughness Rz is imparted to the surface of the copper oxide layer 23 in order to improve the adhesion between the surface thereof and an underfill 7 (see FIGS. 14A and 14B)

which will be described later. The ten point average roughness Rz is typically set in a range of 20 to 200 nm. In this case, the adhesion between the underfill 7 and the copper oxide layer 23 can be effectively improved.

The hole 24 is formed in the copper oxide layer 23 in the vicinity of a central part of the electrode portion 21. This hole 24 is formed to penetrate the copper oxide layer 23 so that the copper layer 22 is partially exposed from the copper oxide layer 23. A diameter φ of this hole 24 is set, for example, to approximately 20 to 100 μm.

On the copper layer 22 exposed by the hole 24, a solder bump 1 for flip chip mounting is formed. Hereinafter, the copper layer 22 partially exposed by the hole 24 is called a copper layer exposing portion 25. That is, the solder bump 1 is formed on the copper layer exposing portion 25 so as to cover the whole surface thereof. A diameter φ of the copper layer exposing portion 25 is the same as the diameter φ of the hole 24 and is set, for example, to approximately 20 to 100 μm. As in the case described above, a diameter φ of the solder bump 1 is also set, for example, to approximately 20 to 100 μm. A height H of the solder bump 1 is set, for example, to 10 to 50 μm.

[Method for Manufacturing Circuit Board]

Next, a method for manufacturing the circuit board 10 will be described.

FIGS. 3A to 7B are schematic views each illustrating the method for manufacturing the circuit board 10. FIGS. 3A, 4A, 5A, 6A, and 7A are plan views each showing the circuit board 10 in each step. FIGS. 3B, 4B, 5B, 6B, and 7B are cross-sectional views taken along the lines IIIB-IIIB, IVB-IVB, VB-VB, VIB-VIB, and VIIB-VIIB shown in FIGS. 3A, 4A, 5A, 6A, and 7A, respectively.

Figure 3A:
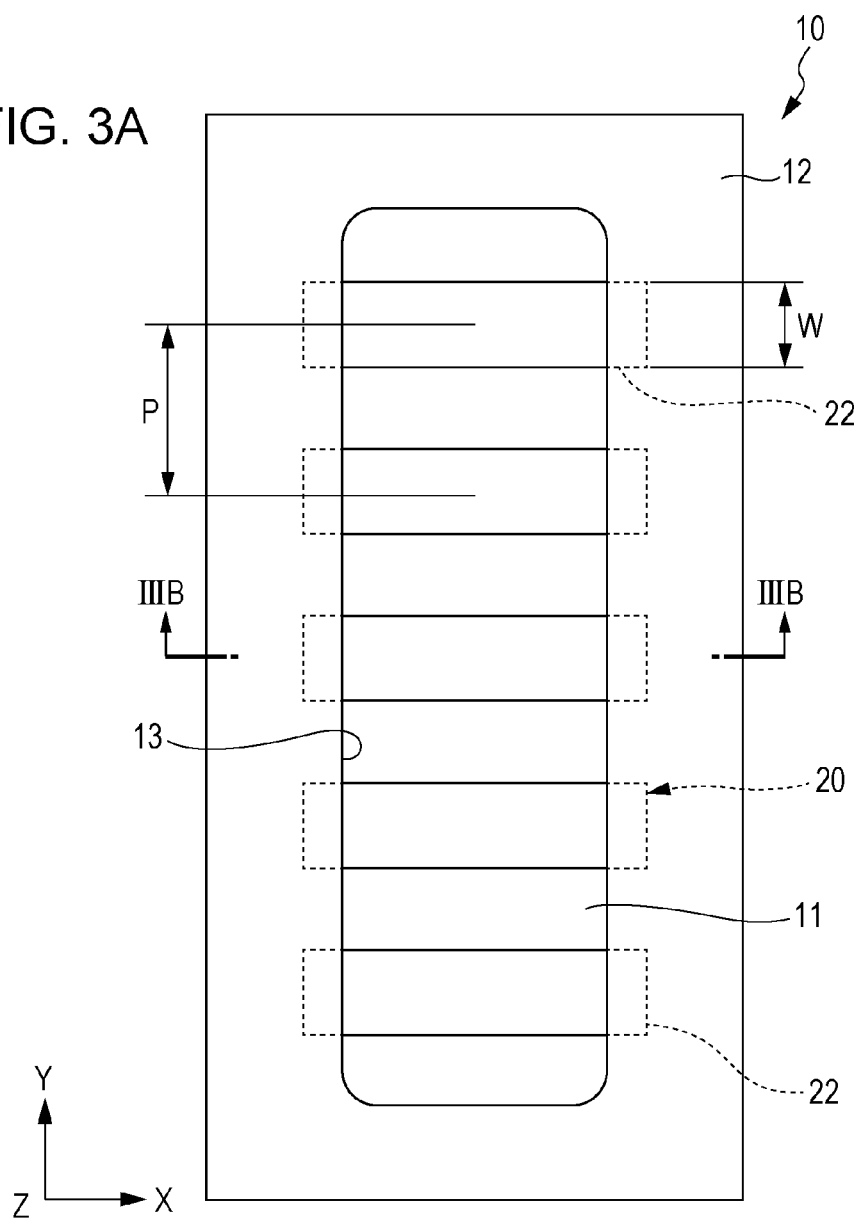
FIGS. 3A and 3B are schematic views each illustrating a method for manufacturing a circuit board.
Figure 3B:
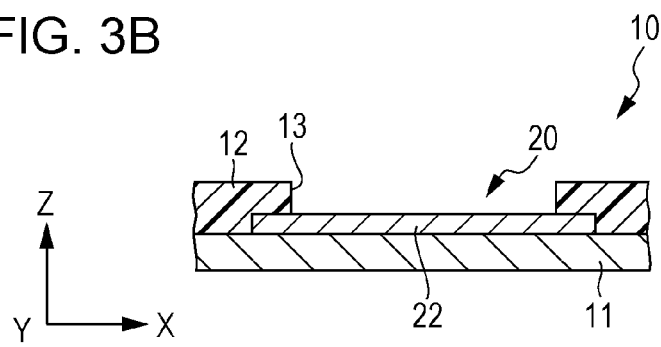

As shown in FIGS. 3A and 3B, the circuit board 10 including the substrate 11, the wiring sections 20 provided thereon, and the solder resist 12 provided on the substrate 11 and the wiring sections 20 is prepared. The solder resist 12 has the opening 13, and the substrate 11 and the wiring sections 20 are partially exposed at the upper side through this opening 13. In this example, the width W of the wiring section 20 (electrode portion 21) was set to 30 μm, and the pitch P between the wiring sections 20 (between the electrode portions 21) was set to 60 μm.

Figure 4A:
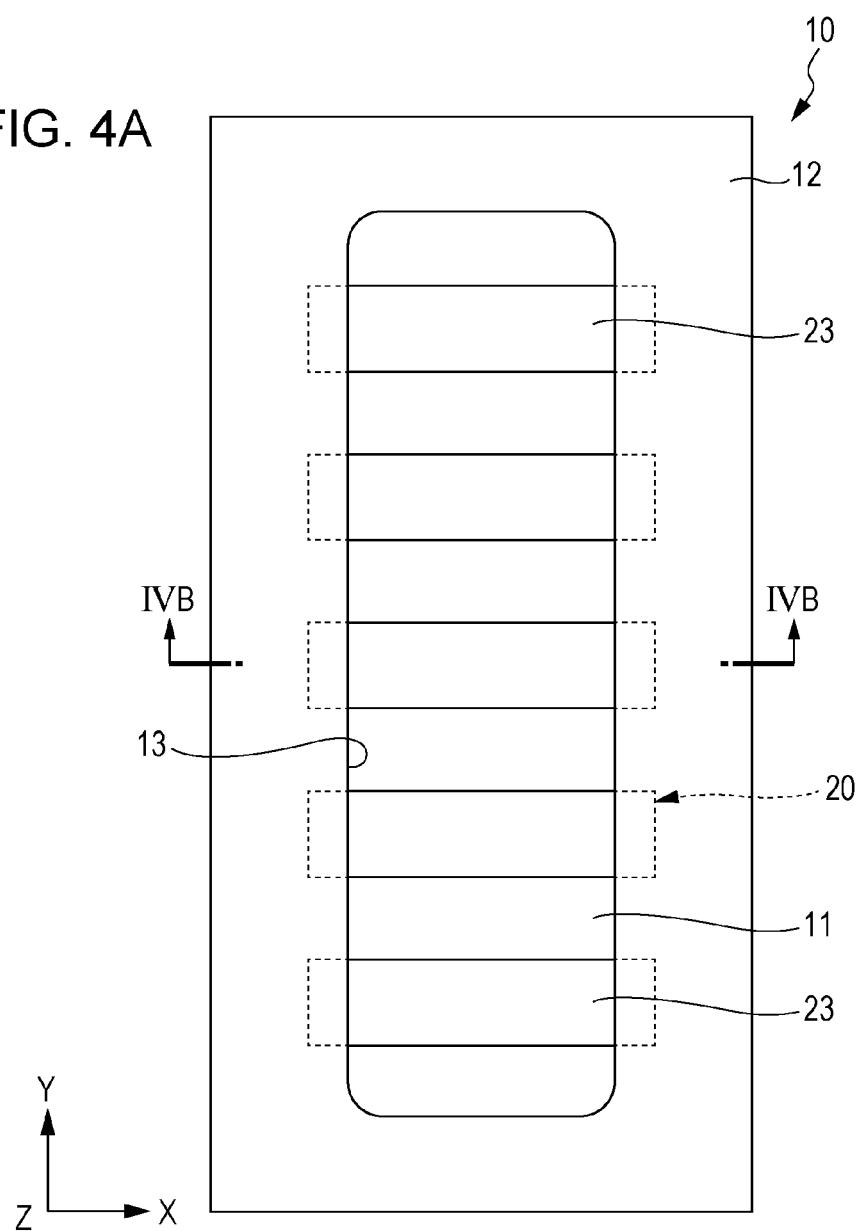
FIGS. 4A and 4B are schematic views each illustrating the method for manufacturing a circuit board.
Figure 4B:
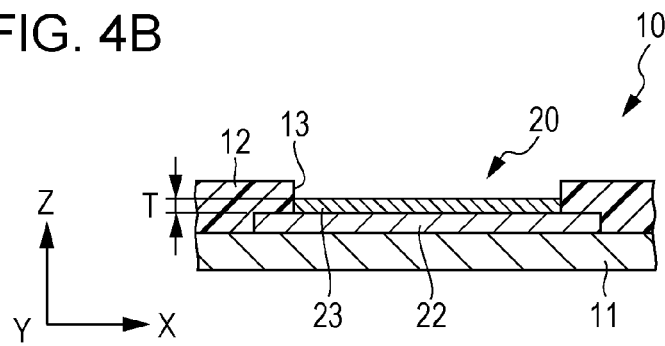

As shown in FIGS. 4A and 4B, next, the copper oxide layer 23 is formed by performing a wet treatment on the copper layer 22 exposed through the opening 13 of the solder resist 12. In this example, the thickness T of the copper oxide layer 23 was set to 40 Å. According to this embodiment, when the copper oxide layer 23 is formed by a wet treatment, the ten point average roughness Rz is simultaneously imparted to the copper oxide layer 23. In this example, the ten point average roughness Rz was set to 30 nm.

Figure 8:
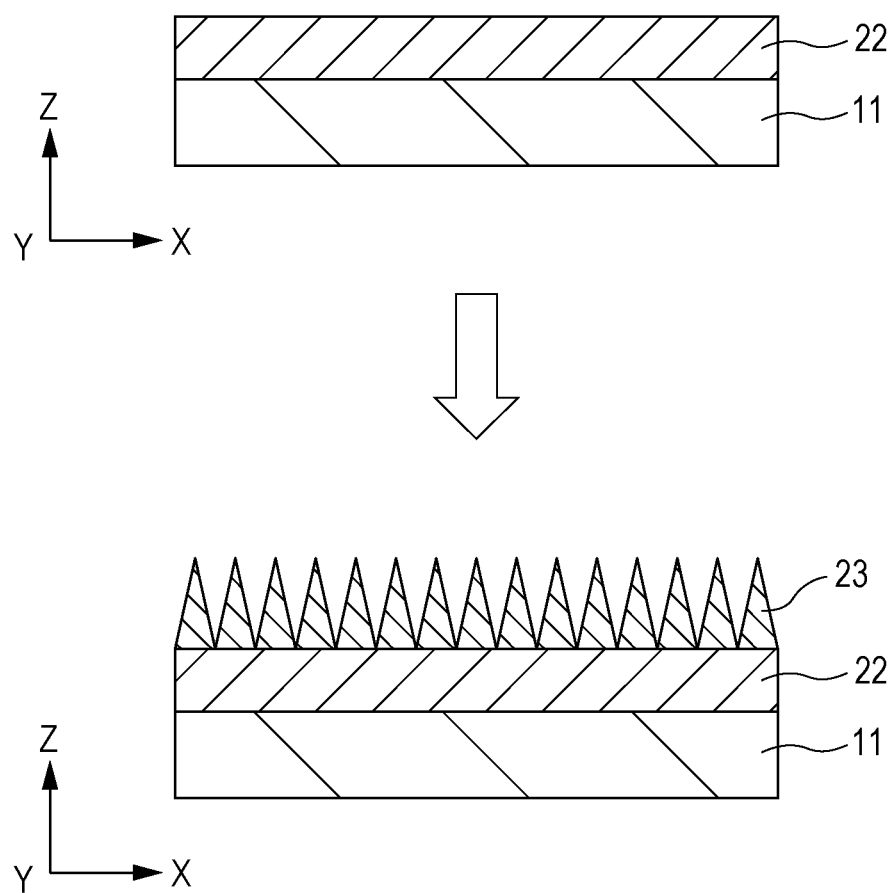
FIG. 8 is a schematic view showing the state in which a copper oxide layer to which a ten point average roughness Rz is imparted is formed by a wet treatment.

FIG. 8 is a schematic view showing the state in which the copper oxide layer 23 to which the ten point average roughness Rz is imparted is formed by a wet treatment.

In a wet treatment chemical used for forming the copper oxide layer 23, for example, oxidizing agents, such as sodium chlorite ($NaClO_2$) and potassium chlorite ($KClO_2$), and sodium hydroxide (NaOH) may be contained. The oxidizing agents, such as sodium chlorite and potassium chlorite, are used to generate the copper oxide layer 23, and sodium hydroxide is used to grow the copper oxide layer 23.

The following formulas (1) to (3) indicate chemical reactions when sodium chlorite is used to generate a copper oxide.

(1)

(2)

(3)

In addition, the following formulas (4) and (5) indicate chemical reactions when a copper oxide is grown by sodium hydroxide.

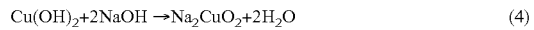
(4)

(5)

By the wet treatment using at least one of the wet treatment chemicals as described above, when the copper oxide layer 23 is formed, the ten point average roughness Rz can be easily imparted thereto at the same time.

Figure 5A:
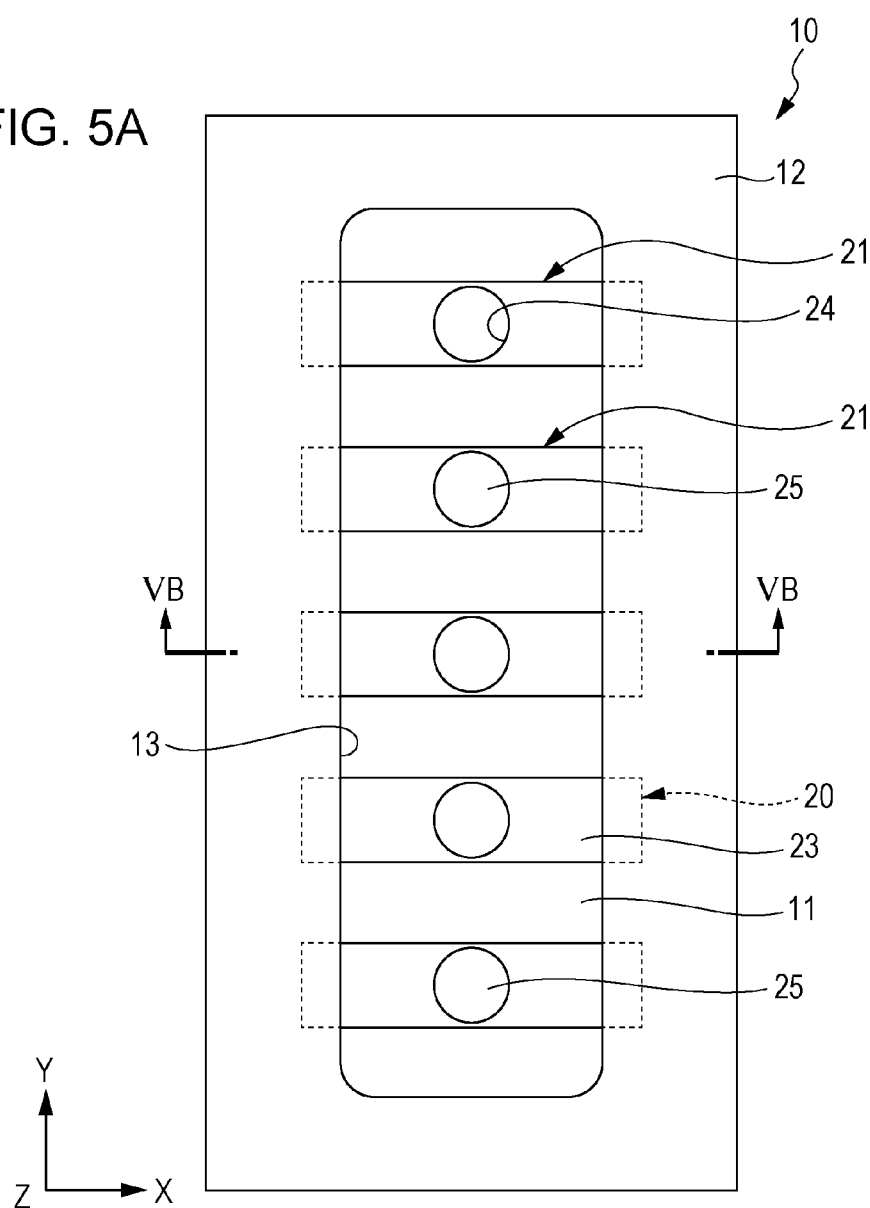
FIGS. 5A and 5B are schematic views each illustrating the method for manufacturing a circuit board.
Figure 5B:
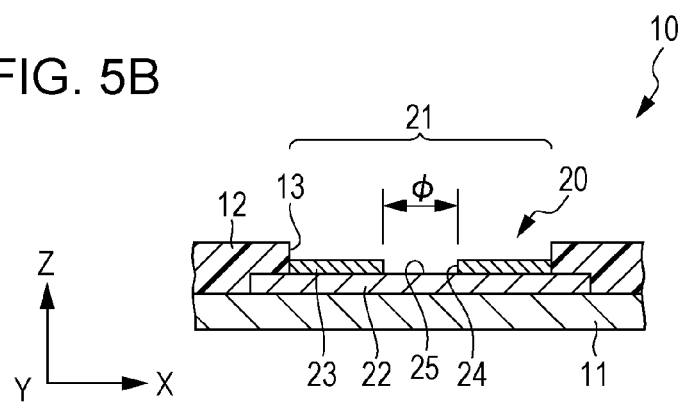

As show in FIGS. 5A and 5B, the copper oxide layer 23 is partially removed by UV (Ultraviolet) laser irradiation performed thereon, and the hole 24 which penetrates the copper oxide layer 23 is formed. As the UV laser, for example, a UV laser having a wavelength of 366 nm is used. In addition, instead of the UV laser, other lasers, such as an excimer laser, may also be used. In this example, the diameter φ of the hole 24 was set to 30 μm. Since the hole 24 is formed in the copper oxide layer 23, the copper layer 22 is partially exposed, and the copper layer exposing portion 25 is formed. By the steps described above, the electrode portion 21 having the copper layer 22, the copper oxide layer 23 provided thereon, and the hole 24 formed in the copper oxide layer 23 is formed.

Figure 6A:
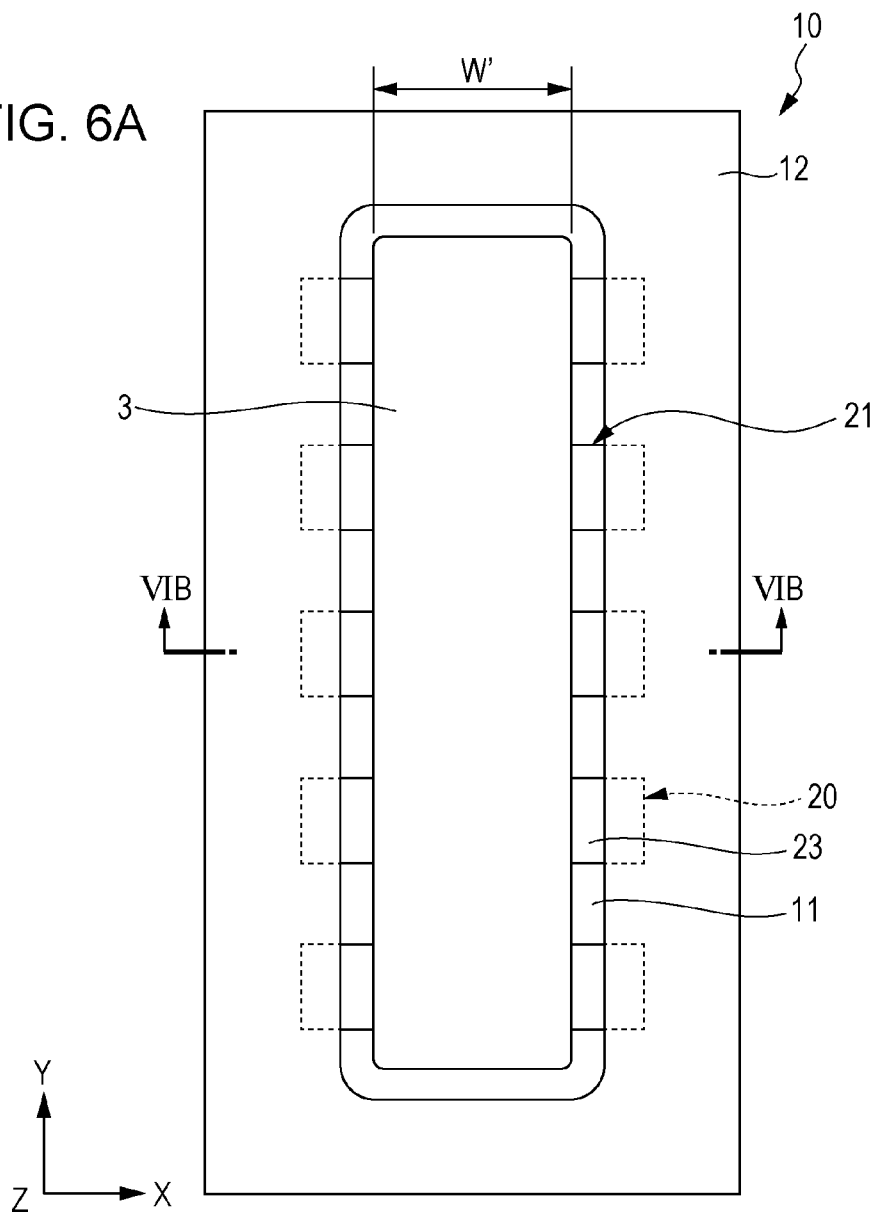
FIGS. 6A and 6B are schematic views each illustrating the method for manufacturing a circuit board.
Figure 6B:
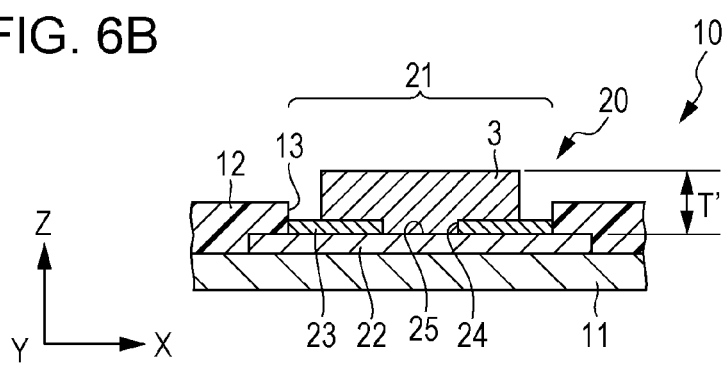

As shown in FIGS. 6A and 6B, cream solder 3 is applied on the electrode portion 21. In this step, the cream solder 3 is applied at a position corresponding to the opening 13 of the solder resist 12 along the direction (Y axial direction) in which the electrode portions 21 are arranged.

Accordingly, the cream solder 3 is simultaneously applied to all the electrode portions 21. The cream solder 3 is applied on the copper layer 22 partially exposed through the hole 24 (on the copper layer exposing portion 25) and the copper oxide layer 23 located along the periphery of the hole 24.

In this example, a width W' of the cream solder 3 was set to 50 μm, and a thickness T' thereof was set to 40 μm.

A flux is contained in the cream solder 3. An active force of the flux is controlled so as to remove a copper oxide film (thickness is smaller than 10 Å) which is naturally formed on the copper layer exposing portion 25 when it comes into contact with air. In addition, the active force of the flux is also controlled so as not to remove the copper oxide layer 23 (thickness T is approximately 20 to 80 Å) intentionally formed on the copper layer 22. As a result, while an unnecessary copper oxide film unfavorably formed on the copper layer exposing portion 25 is appropriately removed, the copper oxide layer 23 to which the ten point average roughness is imparted and which functions as a portion in close contact with the underfill 7 (see FIGS. 14A and 14B) can be prevented from being removed.

As the cream solder 3, for example, when heat is applied to the cream solder 3 to form the solder bump 1, special cream solder 3 may be used which is capable of arbitrarily adjusting the size (height H) of this solder bump 1. This special cream solder 3 is formed so the growth is stopped when the solder bump 1 reaches a certain size (height H). Even if printing accuracy of the thickness T' of the cream solder 3 or the like is not so high, by using the special cream solder 3 as described above, a solder bump 1 having an arbitrary size (height H) can be formed.

When the cream solder 3 is applied on the electrode portion 21, heat at a temperature of 270° C. or the like is then applied to the cream solder 3. Incidentally, solder is easily adhered to copper and is not easily adhered to a copper oxide. This relationship is used in the present disclosure. That is, when the cream solder 3 is heated, solder is grown on the copper layer exposing portion 25 to which the solder is easily adhered, and thereby, the solder bump 1 is formed on the copper layer exposing portion 25. On the other hand, since solder is not grown on a copper oxide to which the solder is not easily adhered, the solder bump 1 is not formed on the copper oxide layer 23.

Figure 7A:
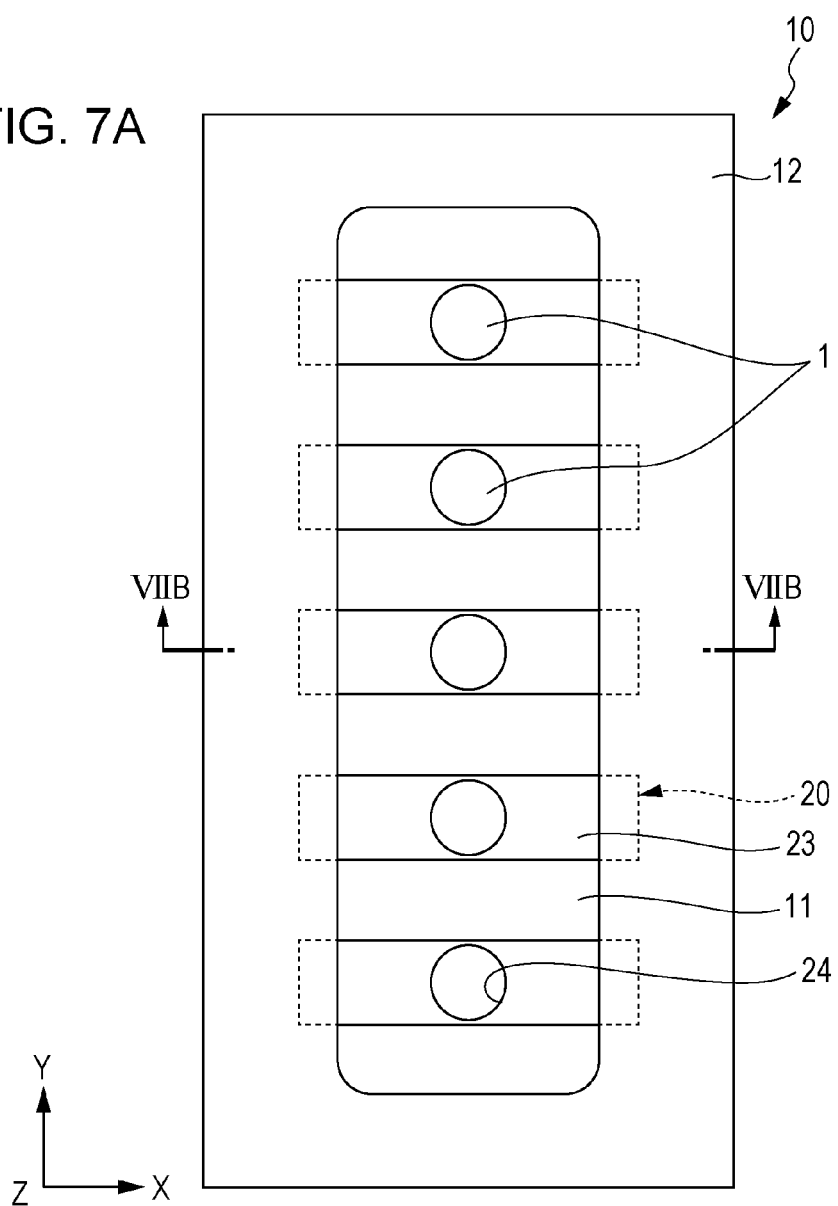
FIGS. 7A and 7B are schematic views each illustrating the method for manufacturing a circuit board.
Figure 7B:
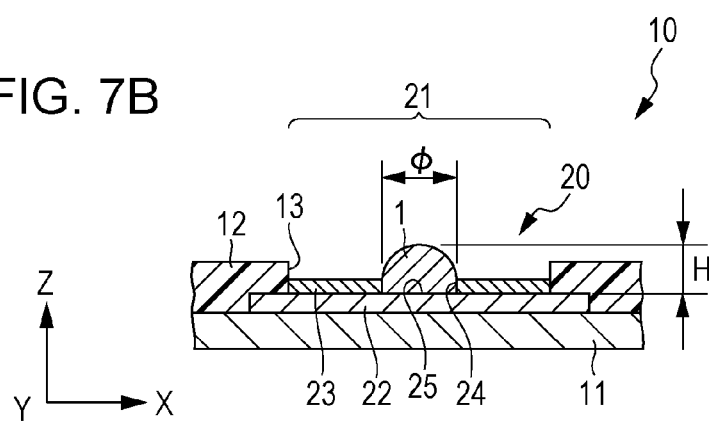

After the heating is completed, the circuit board 10 is washed, and unnecessary cream solder 3 is removed. FIGS. 7A and 7B are views showing the circuit board 10 after the heating and the washing. As shown in FIGS. 7A and 7B, the solder bump 1 (Sn0.7 Cu) is formed on the copper layer exposing portion 25. In this example, the diameter φ of the solder bump 1 was set to 30 μm, and the height H of the solder bump 1 was set to 15 μm.

As described above, according to the present disclosure, since the solder bump 1 can be formed on the copper layer exposing portion 25 corresponding to the hole 24 which penetrates the copper oxide layer 23, a minute solder bump can be easily formed on the electrode portion 21 by adjusting the size of the hole 24. In addition, according to the present disclosure, the wiring section 20 can be partially used as the electrode portion 21, and the shape of the electrode portion 21 is not necessarily complicated. Hence, the pitch between the electrode portions 21 can be easily decreased while cost is reduced. As described above, the circuit board 10 according to this embodiment is able to appropriately respond the request, for example, to decrease the pitch between the bumps 61 of the semiconductor element 60.

Figure 9A:
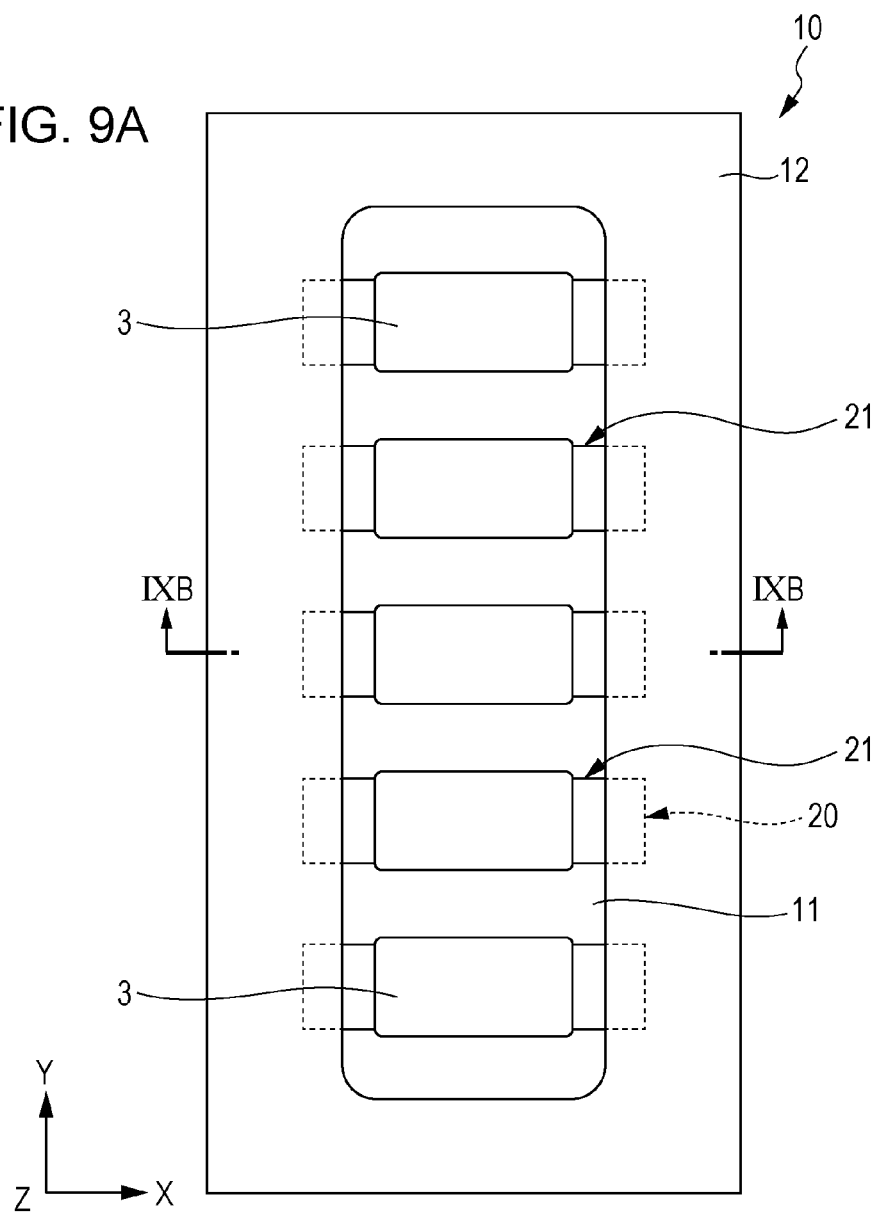
FIGS. 9A and 9B are schematic views each showing one example of the case in which cream solder is separately applied to respective electrode portions.
Figure 9B:
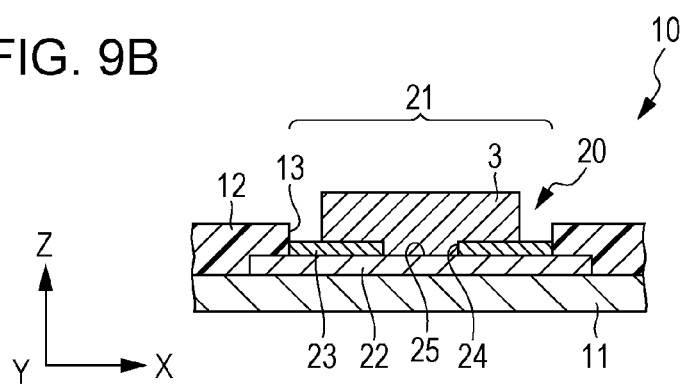

With reference to FIGS. 6A and 6B, the case in which the cream solder 3 is simultaneously formed on all the electrode portions 21 is described by way of example. However, the cream solder 3 may also be applied separately to the respective electrode portions 21. FIGS. 9A and 9B are each a schematic view showing the case in which the cream solder 3 is applied separately to the respective electrode portions 21 by way of example. FIG. 9A is a plan view of the circuit board 10, and FIG. 9B is a cross-sectional view taken along the line IXB-IXB shown in FIG. 9A.

[Method for Manufacturing Semiconductor Device]

Next, a method for manufacturing a semiconductor device 100 by performing flip chip mounting of the semiconductor element 60, such as an IC (integrated circuit) chip, on the circuit board 10 will be described.

FIGS. 10A to 14B are schematic views each illustrating the method for manufacturing the semiconductor device 100. FIGS. 10A, 11A, 12A, 13A, and 14A are plan views each showing the circuit board 10 (and the semiconductor element 60) in each step. FIGS. 10B, 11B, 12B, 13B, and 14B are cross-sectional views taken along the lines XB-XB, XIB-XIB, XIIB-XIIB, XIIIB-XIIIB, and XIVB to XIVB shown in FIGS. 10A, 11A, 12A, 13A, and 14A, respectively.

The case in which an interposer 50 is used as the circuit board 10 will be described by way of example.

Figure 10A:
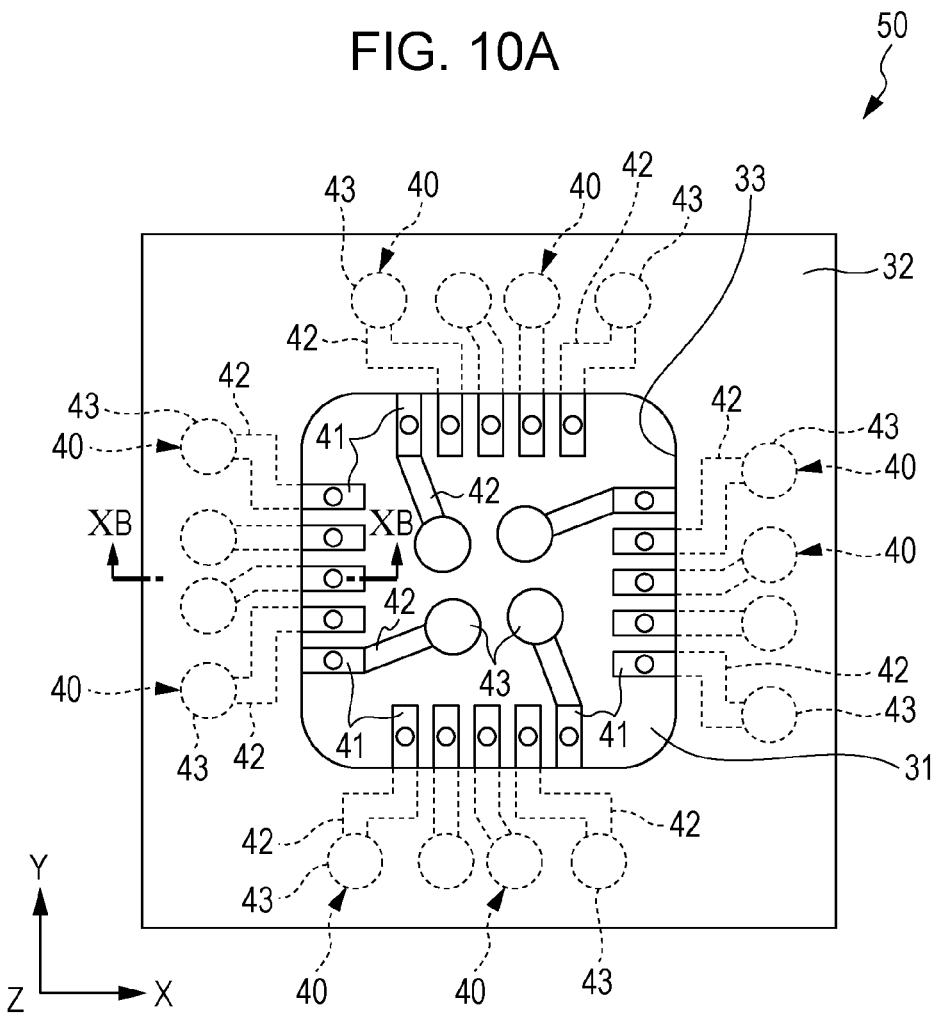
FIGS. 10A and 10B are schematic views each illustrating a method for manufacturing a semiconductor device according to one embodiment of the present disclosure.
Figure 10B:
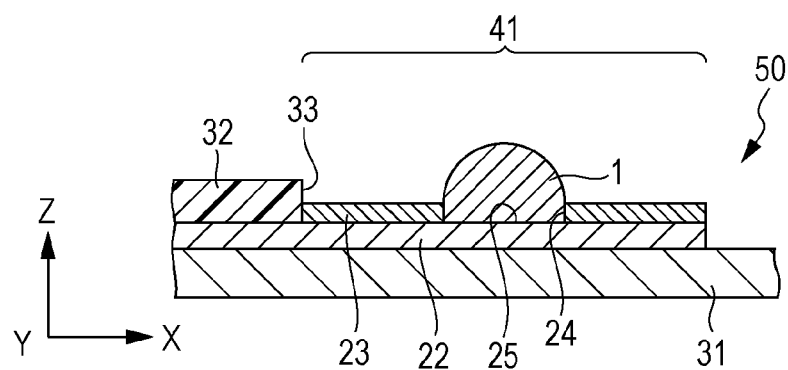

As shown in FIGS. 10A and 10B, the interposer 50 includes a substrate 31, a plurality of wiring sections 40 provided thereon, and a solder resist 32 formed on the substrate 31 and the wiring sections 40. The solder resist 32 has an opening 33 at the center thereof A center portion of the substrate 31 and parts of the wiring sections 40 are exposed at an upper side of the interposer 50 through this opening 33.

In this example, five wiring sections 40 are formed on each of the four areas of the substrate 31 located in a vertical and a horizontal direction, so that totally 20 wiring sections 40 are formed. The wiring section 40 has a wiring portion 42, an electrode portion 41 provided at one end thereof, and a via 43 provided at the other end of the wiring portion 42. Five electrode portions 41 of the respective wiring sections 40 are formed along each of the four sides of the opening 33 of the solder resist 32 located in a vertical and a horizontal direction. The electrode portion 41 is formed at a central side apart from the four sides of the opening 33 and is exposed at an upper side of the interposer 50.

Among the 20 wiring sections 40, attention is paid on the five wiring sections 40 forming one group. Four wiring sections 40 among the five wiring sections 40 are each formed such that the wiring portion 42 and the via 43 are formed toward the outside from the electrode portion 41 and are covered with the solder resist 32. On the other hand, the remaining one wiring section 40 among the five wiring sections 40 is formed such that the wiring portion 42 and the via 43 are formed towards the central side from the electrode portion 41, and this wiring section 40 is entirely exposed at the upper side of the interposer 50.

The electrode portion 41 has the copper layer 22, the copper oxide layer 23, and the hole 24, and the solder bump 1 is formed on the copper layer exposing portion 25 exposed through the hole 24. The structures of the electrode portion 41 and the solder bump 1 and manufacturing methods thereof are typically the same as those of the electrode portion 21 and the solder bump 1 described with reference to FIGS. 1 to 9B.

With reference to FIGS. 11A and 11B, a flux 5 is applied on the electrode portions 41. The flux 5 is applied to cover all the 20 electrode portions 41. When the flux 5 is applied, the surface of solder bump 1 and the surface of the copper oxide layer 23 are covered with the flux 5. An active force of this flux 5 is controlled so as to remove an oxide film formed on the surface of the solder bump 1 and so as not to remove the copper oxide layer 23 to which the ten point average roughness Rz is imparted. Accordingly, while the oxide film formed on the surface of the solder bump 1 is appropriately removed, the copper oxide layer 23 which functions as a portion in close contact with the underfill 7 and to which the ten point average roughness is imparted can be prevented from being removed by the flux 5.

With reference to FIGS. 12A and 12B, in the state in which the flux 5 is applied, the bump 61 (joint portion) provided on a bottom surface of the semiconductor element 60, such as an IC chip, is aligned on the solder bump 1. Subsequently, a heat treatment is performed, and the bump 61 on the semiconductor element 60 and the electrode portion 41 (copper layer exposing portion 25) of the interposer 50 are fusion-joined to each other with the solder bump 1 provided therebetween. Accordingly, the bump 61 and the electrode portion 41 (copper layer exposing portion 25) are electrically connected to each other. In addition, the active force of the flux 5 may be controlled so as to be able to remove an oxide film formed on the surface of the bump 61 on the semiconductor element 60 (and an oxide film of the solder bump 1) and so as not to be able to remove the copper oxide layer 23.

Figure 13A:
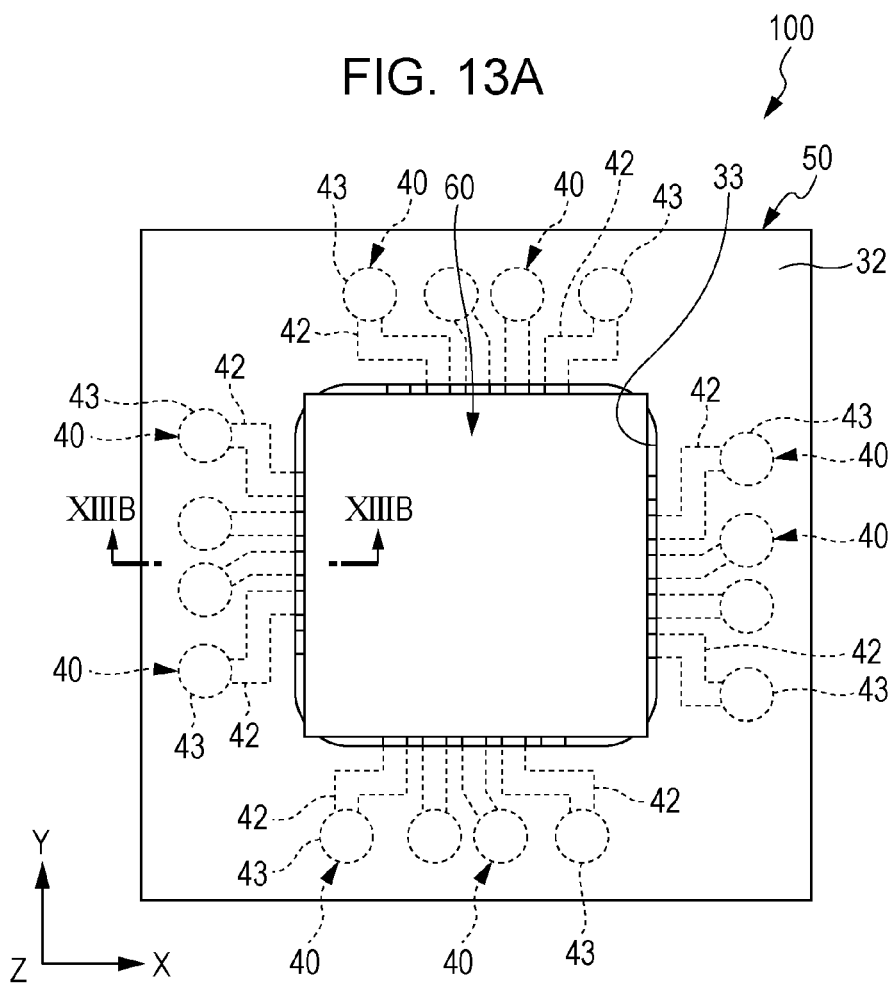
FIGS. 13A and 13B are schematic views each illustrating the method for manufacturing a semiconductor device.
Figure 13B:
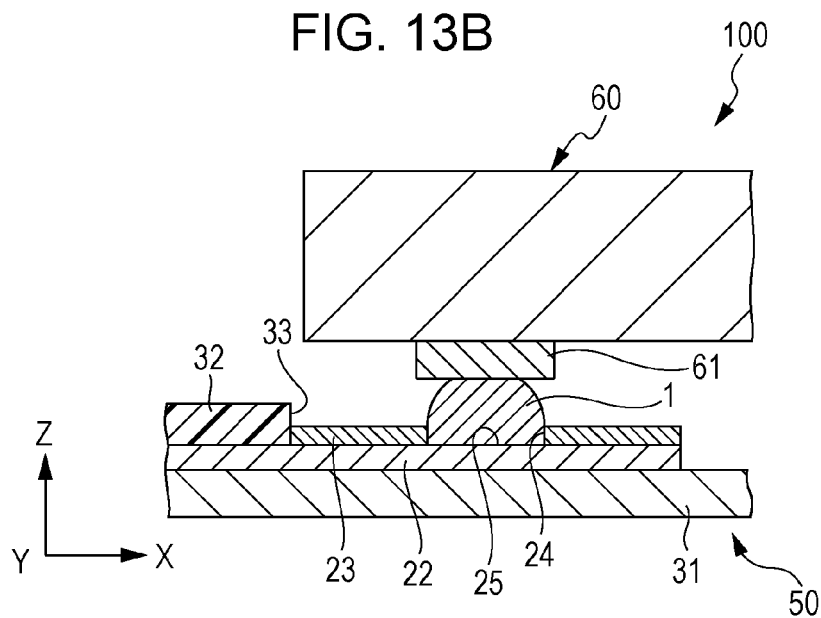

With reference to FIGS. 13A and 13B, a washing treatment is performed after the heat treatment, so that the flux 5 is removed. Next, with reference to FIGS. 14A and 14B, an underfill 7 agent is filled between the semiconductor element 60 and the interposer 50, and a heat treatment is then performed. Accordingly, the underfill 7 fixing the semiconductor element 60 to the interposer 50 is formed therebetween.

Hence, the semiconductor element 60 is flip-chip mounted to the interposer 50, so that the semiconductor device 100 is manufactured.

As described above, the copper oxide layer 23 has on the surface thereof a ten point average roughness Rz of approximately 20 to 200 nm. Therefore, in this embodiment, the adhesion between the underfill 7 and the copper oxide layer 23 can be improved. In this case, the copper oxide layer 23 is in close contact with the underfill 7 along the periphery of the solder bump 1.

For example, in the case in which the semiconductor device 100 is mounted on a mother board or the like, when heat is again applied to the semiconductor device 100, the solder bump 1 may be remelted in some cases. In the case as described above, since the copper oxide layer 23 is tightly in close contact with the underfill 7 along the periphery of the solder bump 1 in this embodiment, a phenomenon in which a remelted solder bump 1 flows into between the surface of the copper oxide layer 23 and the underfill 7 can be prevented. Hence, the reliability of the joining between the bump 61 and the electrode portion 41 (copper layer exposing portion 25), that is, the reliability 60 of the mounting between the semiconductor element 60 and the interposer 50 (circuit board 10), can be improved.

With reference to FIGS. 11A to 12B, as a method for removing an oxide film on the surface of the solder bump 1, the case in which the flux 5 is used is described. However, as the method for removing an oxide film on the surface of the solder bump 1, the method using the flux 5 may not be necessarily used. In this case, for example, a gas reduction method using a forming gas ($N_2$=95%, $H_2$=5%) may be used, and a wet reduction method using formic acid (HCOOH) may be used. In addition, an MW (microwave) plasma reduction method using MW plasma may also be used.

Heretofore, although the case has been described in which the electrode portion 21 (electrode portion 41) and the solder bump 1 are provided at a circuit board 10 (interposer 50) side, and the joint portion (bump 61) is provided at a semiconductor element 60 side, the case in which the structure is opposite to that described above may also be used. That is, the electrode portion 21 and the solder bump 1 may be provided at the semiconductor element 60 side, and at the circuit board 10 (interposer 50) side, the joint portion may be provided.

In addition, although the flip chip mounting between the semiconductor element 60 and the circuit board 10 (interposer 50) has been described, the present disclosure is not limited thereto. The present disclosure may also be applied to flip chip mounting between the semiconductor elements 60 (such as flip chip mounting between an IC chip and an IC chip) and flip chip mounting between the circuit boards 10 (such as flip chip mounting between the interposer 50 and a mother board).

In addition, the present disclosure may also have the following structures in an embodiment.

There is provided in an embodiment a circuit board including an electrode portion which has a copper layer, a copper oxide layer formed thereon, and a removal portion formed by partially removing the copper oxide layer so as to partially expose the copper layer from the copper oxide layer, and a solder bump for flip chip mounting formed on the copper layer exposed by the removal portion.

In the circuit board according to an embodiment, the copper oxide layer is formed on the copper layer so that a predetermined ten point average roughness Rz is imparted to the surface of copper oxide layer.

In the circuit board according to an embodiment, the ten point average roughness Rz is in a range of 20 to 200 nm.

In the circuit board according to an embodiment, the copper oxide layer is formed on the copper layer when a wet treatment is performed thereon, and when the copper oxide layer is formed by the wet treatment, the ten point average roughness Rz is imparted to the surface of the copper oxide layer.

In the circuit board according to an embodiment, the solder bump is formed when cream solder having an active force controlled so as to remove a copper oxide film unfavorably formed on the copper layer exposed by the removal portion and so as not to remove the copper oxide layer to which the ten point average roughness Rz is imparted is applied on the electrode portion.

There is provided in an embodiment a semiconductor element including an electrode portion which has a copper layer, a copper oxide layer formed thereon, and a removal portion formed by partially removing the copper oxide layer so as to partially expose the copper layer from the copper oxide layer, and a solder bump for flip chip mounting formed on the copper layer exposed by the removal portion.

There is provided in an embodiment a semiconductor device including a circuit board which has an electrode portion having a copper layer, a copper oxide layer formed thereon, and a removal portion formed by partially removing the copper oxide layer so as to partially expose the copper layer from the copper oxide layer and a solder bump for flip chip mounting formed on the copper layer exposed by the removal portion, and a semiconductor element which has a joint portion to be fusion-joined to the copper layer exposed by the removal portion with the solder bump provided therebetween and which is flip-chip mounted to the circuit board.

In the semiconductor device according to an embodiment, the copper oxide layer is formed on the copper layer so that a predetermined ten point average roughness Rz is imparted to the surface of the copper oxide layer, and the semiconductor device further includes an underfill which is filled between the circuit board and the semiconductor element and fixes the circuit board to the semiconductor element while being placed in close contact with the surface of the copper oxide layer to which the ten point average roughness Rz is imparted.

In the semiconductor device according to an embodiment, the copper layer exposed by the removal portion and the joint portion are fusion-joined to each other with the solder bump provided therebetween in the state in which a flux having an active force controlled so as to remove an oxide film formed on the surface of the solder bump and so as not to remove the copper oxide layer to which the ten point average roughness Rz is imparted is applied on the solder bump and the copper oxide layer.

There is provided in an embodiment a semiconductor device including a semiconductor element which has an electrode portion having a copper layer, a copper oxide layer formed thereon, and a removal portion formed by partially removing the copper oxide layer so as to partially expose the copper layer from the copper oxide layer and a solder bump for flip chip mounting formed on the copper layer exposed by the removal portion, and a circuit board which has a joint portion to be fusion-joined to the copper layer exposed by the removal portion with the solder bump provided therebetween and to which the semiconductor element is flip-chip mounted.

There is provided in an embodiment a method for manufacturing a circuit board including forming a copper oxide layer on a copper layer of an electrode portion of a circuit board, forming a removal portion by partially removing the copper oxide layer so as to partially expose the copper layer from the copper oxide layer, and forming a solder bump for flip chip mounting on the copper layer exposed by the removal portion.

In the method for manufacturing a circuit board according to an embodiment, the forming a copper oxide layer is to form the copper oxide layer so that a predetermined ten point average roughness Rz is imparted to the surface thereof In the method for manufacturing a circuit board according to an embodiment, the ten point average roughness Rz is in a range of 20 to 200 nm.

In the method for manufacturing a circuit board according to an embodiment, the forming a copper oxide layer is to form the copper oxide layer on the copper layer by a wet treatment, and when the copper oxide layer is formed by the wet treatment, the ten point average roughness Rz is imparted to the surface of the copper oxide layer.

In the method for manufacturing a circuit board according to an embodiment, the forming a solder bump is to form the solder bump by applying cream solder on the electrode portion, the cream solder having an active force controlled so as to remove a copper oxide film unfavorably formed on the copper layer exposed by the removal portion and so as not to remove the copper oxide layer to which the ten point average roughness Rz is imparted.

There is provided an embodiment a method for manufacturing a semiconductor element including forming a copper oxide layer on a copper layer of an electrode portion of a semiconductor element, forming a removal portion by partially removing the copper oxide layer so as to partially expose the copper layer from the copper oxide layer, and forming a solder bump for flip chip mounting on the copper layer exposed by the removal portion.

There is provided an embodiment a method for manufacturing a semiconductor device including forming a copper oxide layer on a copper layer of an electrode portion of a circuit board, forming a removal portion by partially removing the copper oxide layer so as to partially expose the copper layer from the copper oxide layer, forming a solder bump for flip chip mounting on the copper layer exposed by the removal portion, and performing fusion joining between the copper layer exposed by the removal portion and a joint portion of a semiconductor element.

In the method for manufacturing a semiconductor device according to an embodiment, the forming a copper oxide layer is to form the copper oxide layer so that a predetermined ten point average roughness Rz is imparted to the surface thereof, and the above method for manufacturing a semiconductor device further includes filling an underfill between the circuit board and the semiconductor element, and fixing the circuit board to the semiconductor element with the underfill while the underfill is placed in close contact with the surface of the copper oxide layer to which the ten point average roughness Rz is imparted.

In the method for manufacturing a semiconductor device according to an embodiment, the performing fusion joining is performed such that a flux having an active force controlled so as to remove an oxide film formed on the surface of the solder bump and so as not to remove the surface of the copper oxide layer to which the ten point average roughness Rz is imparted is applied on the solder bump and the copper oxide layer, and in the state in which the flux is applied on the solder bump and the copper oxide layer, the copper layer exposed by the removal portion and the joint portion of the semiconductor element are fusion-joined to each other with the solder bump provided therebetween.

There is provided an embodiment a method for manufacturing a semiconductor device including: forming a copper oxide layer on a copper layer of an electrode portion of a semiconductor element, forming a removal portion by partially removing the copper oxide layer so as to partially expose the copper layer, forming a solder bump for flip chip mounting on the copper layer exposed by the removal portion, and performing fusion joining between the copper layer exposed by the removal portion and a joint portion of a circuit board with the solder bump provided therebetween.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device comprising:
a circuit board including
  an electrode portion having
    a copper layer,
    a copper oxide layer formed thereon, the copper oxide layer comprising a surface having a ten point average roughness in a range of 20 to 200 nm, and
    a removal portion formed by partially removing the copper oxide layer so as to partially expose the copper layer from the copper oxide layer, and
  a solder bump for flip chip mounting formed on the copper layer exposed by the removal portion;
a semiconductor element which has a joint portion to be fusion-joined to the copper layer exposed by the removal portion with the solder bump provided therebetween and which is flip-chip mounted to the circuit board; and
a solder resist extending on the copper layer only outside a periphery of the semiconductor element.

2. The semiconductor device according to claim 1, wherein the solder bump is formed by applying cream solder on the electrode portion, the cream solder having an active force controlled so as to remove a copper oxide film formed on the copper layer exposed by the removal portion and so as not to remove the copper oxide layer to which the ten point average roughness Rz is imparted.

3. The semiconductor device according to claim 1, wherein the copper oxide layer is formed on the copper layer when a wet treatment is performed thereon, and when the copper oxide layer is formed by the wet treatment, the ten point average roughness Rz is imparted to the surface of the copper oxide layer.

4. The semiconductor device according to claim 1, wherein the copper oxide layer is formed on the copper layer so that a predetermined ten point average roughness Rz is imparted to the surface of the copper oxide layer, the semiconductor device further comprising:
an underfill which is filled between the circuit board and the semiconductor element and which fixes the circuit board to the semiconductor element while being placed in close contact with the surface of the copper oxide layer to which the ten point average roughness Rz is imparted.

5. The semiconductor device according to claim 4, wherein the copper layer exposed by the removal portion and the joint portion are fusion-joined to each other with the solder bump provided therebetween in the state in which a flux having an active force controlled so as to remove an oxide film formed on the surface of the solder bump and so as not to remove the copper oxide layer to which the ten point average roughness Rz is imparted is applied on the solder bump and the copper oxide layer.

6. A semiconductor device comprising:
a semiconductor element including
  an electrode portion having
    a copper layer, a copper oxide layer formed thereon, the copper oxide layer comprising a surface having a ten point average roughness in a range of 20 to 200 nm, and a removal portion formed by partially removing the copper oxide layer so as to partially expose the copper layer from the copper oxide layer, and a solder bump for flip chip mounting formed on the copper layer exposed by the removal portion, and a solder resist extending on the copper layer only along one side of the electrode portion; and a circuit board which has a joint portion to be fusion-joined to the copper layer exposed by the removal portion with the solder bump provided therebetween and to which the semiconductor element is flip-chip mounted.

7. The semiconductor device according to claim 6, wherein a thickness of the copper oxide layer has an upper limit of approximately 80 Å.

8. The semiconductor device according to claim 1, wherein a thickness of the copper oxide layer has an upper limit of approximately 80 Å.

9. The semiconductor device according to claim 1, wherein the copper oxide layer consists essentially of cupric oxide.

10. The semiconductor device according to claim 6, wherein the copper oxide layer consists essentially of cupric oxide.

* * * * *